(12) United States Patent
Kim et al.

(10) Patent No.: US 11,476,402 B2
(45) Date of Patent: Oct. 18, 2022

(54) CIRCUIT AND METHOD FOR DETECTING PRESSURE SIGNAL WITH SIGNAL DUE TO PYROELECTRICITY IN PIEZOELECTRIC MATERIAL BEING SUPPRESSED

(71) Applicant: DAIKIN INDUSTRIES, LTD., Osaka (JP)

(72) Inventors: Hyunsik Kim, Chungcheongnam-do (KR); Takashi Kanemura, Osaka (JP); Tetsuhiro Kodani, Osaka (JP); Kwan-Young Han, Gyeonggi-do (KR)

(73) Assignee: DAIKIN INDUSTRIES, LTD., Osaka (JP)

( * ) Notice: Subject to any disclaimer, the term of this patent is extended or adjusted under 35 U.S.C. 154(b) by 453 days.

(21) Appl. No.: 16/625,269

(22) PCT Filed: Jun. 26, 2018

(86) PCT No.: PCT/JP2018/024134
§ 371 (c)(1),
(2) Date: Dec. 20, 2019

(87) PCT Pub. No.: WO2019/004179
PCT Pub. Date: Jan. 3, 2019

(65) Prior Publication Data
US 2020/0220066 A1 Jul. 9, 2020

(30) Foreign Application Priority Data
Jun. 26, 2017 (KR) .......................... 10-2017-0080579

(51) Int. Cl.
*G06F 3/041* (2006.01)
*H01L 41/04* (2006.01)
(Continued)

(52) U.S. Cl.
CPC .............. *H01L 41/042* (2013.01); *G01L 1/16* (2013.01); *H01L 41/1132* (2013.01); *H01L 41/193* (2013.01)

(58) Field of Classification Search
CPC ............ G06F 3/041; G06F 3/045; G06F 3/02; G09G 5/00; G01L 1/16; H01L 41/1132; H01L 41/193; H01L 41/042
See application file for complete search history.

(56) References Cited

U.S. PATENT DOCUMENTS

| 4,490,639 A | 12/1984 | Echols et al. |
| 2013/0120290 A1* | 5/2013 | Yu .......................... G06F 3/0488 345/173 |

(Continued)

FOREIGN PATENT DOCUMENTS

| GB | 2544353 | 5/2017 |
| JP | 6098730 | 3/2017 |

(Continued)

OTHER PUBLICATIONS

International Search Report dated Sep. 4, 2018 in International (PCT) Application No. PCT/JP2018/024134.
Extended European Search Report dated Feb. 5, 2021 in corresponding European Patent Application No. 18824539.3.

*Primary Examiner* — Pegeman Karimi
(74) *Attorney, Agent, or Firm* — Wenderoth, Lind & Ponack, L.L.P.

(57) ABSTRACT

The present invention relates to a pressure signal detection circuit and a pressure signal detection method in which a pyroelectric signal from a piezoelectric film is suppressed. More specifically, the pressure signal detection circuit receives input of an input signal from a piezoelectric film, differentiates the input signal for signal component analysis of the input signal, outputs the signal analysis value of the input signal based on the differential value, removes offset of the input signal by using the signal component analysis (Continued)

value, integrates the input signal, and outputs a pressure input signal value from which a heat input signal value is removed.

22 Claims, 21 Drawing Sheets

(51) Int. Cl.
  *G01L 1/16* (2006.01)
  *H01L 41/113* (2006.01)
  *H01L 41/193* (2006.01)

(56) References Cited

U.S. PATENT DOCUMENTS

| | | |
|---|---|---|
| 2016/0202823 A1* | 7/2016 | Kodani ............... G06F 3/04144 345/173 |
| 2017/0033276 A1 | 2/2017 | Kou et al. |
| 2017/0228072 A1* | 8/2017 | Amin .................... G06F 3/0446 |
| 2018/0062679 A1 | 3/2018 | Tanaka |

FOREIGN PATENT DOCUMENTS

| | | |
|---|---|---|
| JP | 6106011 | 3/2017 |
| KR | 10-2016-0048966 | 5/2016 |
| WO | 2016/061155 | 4/2016 |
| WO | 2017/038535 | 3/2017 |

* cited by examiner

CIRCUIT AND METHOD FOR DETECTING PRESSURE SIGNAL WITH SIGNAL DUE TO PYROELECTRICITY IN PIEZOELECTRIC MATERIAL BEING SUPPRESSED

TECHNICAL FIELD

The present invention relates to detection of pressure signals, and more specifically relates to a detection circuit and method that differentiate input signals, comprehend the signal characteristics based on the results, and then segment and output only an input signal from which a heat input signal (pyro signal) has been removed, so as to detect only pressure input signals (piezo signals) from among input signals supplied to a piezoelectric material.

BACKGROUND ART

Piezoelectric materials generate a relatively large force compared with their own weights and have a characteristic of quickly responding to a supplied voltage. With such characteristics, piezoelectric materials are applied to various industries. There are various components using these piezoelectric materials (in other words, the form of the piezoelectric material). Among them, a piezoelectric film is a material that is displaced when force is applied to both its ends, and a voltage is generated in proportion to the displacement. With such characteristics, piezoelectric films are widely used in piezoelectric generators, sensors, ultrasonic transmitters and receivers, and the like.

FIG. 1a is a diagram showing a piezoelectric film, FIG. 1b is a diagram showing the front end of a pressure sensor, and FIG. 1c is a diagram showing an output voltage signal according to input impedance R.

Referring to FIG. 1a to FIG. 1c, pressure sensing using a piezoelectric element is performed by discharging or integrating the charge generated in a piezoelectric film using an impedance adapter or a Miller's integrator in the front end. Among them, the impedance adapter has a characteristic that the output waveform changes according to input impedance R. Then, by integrating the output voltage signal corresponding to the input impedance R, signal information measured by the sensor can be obtained. However, the final signal information thus obtained includes input information of both pressure and heat. Previously, only physical pressure was measured without a pressure signal due to heat, or a method of absorbing heat using a specific substance to thereby reduce the influence of heat was used. However, these techniques are limited in that the heat input signals cannot be completely eliminated.

FIG. 2a is a graph showing the characteristics of a piezoelectric element on a temperature basis, and FIG. 2b is a graph showing the characteristics of a piezoelectric element on humidity basis. FIG. 3a is a diagram showing a pressure input signal from which a heat input signal is removed, and FIG. 3b is a diagram showing both a heat input signal and a pressure input signal.

Pressure sensing is used mainly for touch sensing through a human finger; at this time, input information due to heat is also displayed because of a temperature difference between the finger and the piezoelectric element.

FIGS. 3a and 3b show more specific characteristics of the pressure input signal and the heat input signal. Referring to FIG. 3a, the pressure input signal has characteristics that an input signal upon touching (touch down (pressing)) is output as a positive value, and an input signal upon release (touch up (releasing)) is output as a negative value. Referring to FIG. 3b, there is a difference in output speed between the pressure input signal and the heat input signal. This is because the conduction speed of the temperature input signal is relatively longer (slower) than the conduction speed of the pressure input signal.

CITATION LIST

Patent Documents

Patent Document 1: Japanese Patent No. 6098730
Patent Document 2: Japanese Patent No. 6106011
Patent Document 3: Specification of Published U.S. Patent Application No. 2017/0033276

SUMMARY OF INVENTION

Technical Problem

Therefore, the present invention was proposed in consideration of the various conditions as described above, and an object of the present invention to remove the heat input signal by using the difference in the speed of supplying the pressure input signal and the heat input signal and the differential information, thereby outputting only the pressure input signal.

An object of the present invention is to significantly reduce the influence on the thermal reaction as compared with the prior art, and to increase the reaction speed of the input terminal at the front end, thereby enabling detection of a pressure signal at a higher speed.

Another object of the present invention is to output a signal having a superior thermal reaction attenuation effect compared with the use of an additional process for heat absorption when a piezoelectric material is produced.

The objects of the present invention are not limited to those mentioned above, and unmentioned or other objects would clearly be understood by those skilled in the art from the following descriptions.

Solution to Problem

As described above, examples of a component using a piezoelectric material (in other words, the form of the piezoelectric material) include a piezoelectric film.

The present invention regarding piezoelectric film is explained in detail below. Based on common technical knowledge, the description below also applies to components or forms other than a piezoelectric film.

In order to achieve the above objects, the pressure signal detection circuit in which a pyroelectric signal from a piezoelectric film is suppressed according to the technical idea of the present invention is constituted of a signal processing unit for receiving input of an input signal from a piezoelectric film, a differentiator for differentiating the input signal for the analysis of the signal component of the input signal, a signal processing unit for outputting an analysis value of the signal component of the input signal based on the differential value of the differentiator, an offset removal unit for removing offset of the input signal using the signal component analysis value, and an integrating unit for integrating the input signal to output a pressure input signal value in which a heat input signal value is deleted.

The pressure signal detection circuit is characterized by further comprising a filter unit constituted of a low-pass filter (LPF) and a moving average filter (MAF) for removing noise of the input signal supplied from the signal input unit.

The signal processing unit is characterized by comparing the differentiated input signal value with a preset threshold value to determine whether the input signal is a pressure input signal or a heat input signal. When the differentiated input signal value is equal to or greater than the preset threshold value, the input signal is determined to be a pressure input signal and the integrating unit is executed. When the differentiated input signal value is smaller than the preset threshold value, the input signal is determined to be a heat input signal, and the offset removal unit is executed.

When a pressure input signal during the reference time is not re-detected after the pressure input signal is detected from the differentiated input signal value, the signal processing unit outputs a reset signal for initializing the integrating unit.

When the pressure input signal is not detected from the differentiated input signal value in all sections, the signal processing unit outputs a reset signal for initializing the integrating unit.

The offset removal unit outputs a value obtained by subtracting the heat input signal from the input signal.

In order to achieve the object described above, the pressure signal detection method in which a pyroelectric signal from a piezoelectric film is suppressed according to the technical idea of the present invention is characterized by comprising a signal input step of receiving input of an input signal from a piezoelectric film from a signal processing unit, a differentiating step of differentiating the input signal for the analysis of the signal component of the input signal by an differentiator, a signal processing step of outputting a signal component analysis value of the input signal based on the differential value of the differentiator in a signal processing unit, an offset removal step of removing offset of the input signal using the signal component analysis value of the signal processing unit, and an integrating step of integrating the input signal in the integrating unit to output a pressure input signal value in which a heat input signal value is deleted.

The pressure signal detection method is characterized by further comprising a filter step of removing noise of the input signal in a filter unit so as to remove noise from the input signal supplied from the signal input step.

The signal processing step is characterized by comparing the differentiated input signal value with a preset threshold value to determine whether the input signal is a pressure input signal or a heat input signal. If the value of the differentiated input step is equal to or greater than the predetermined threshold value, the input signal is determined to be a pressure input signal and the integrating step is executed. If the differentiated input signal value is smaller than the predetermined threshold value, the input signal is determined to be a heat input signal, and the offset removal step is executed.

When a pressure input signal during the reference time is not re-detected after the pressure input signal is detected from the differentiated input signal value, the signal processing step outputs a reset signal for initializing the integrating unit (integrating step).

When the pressure input signal is not detected from the differentiated input signal value in all sections, the signal processing step outputs a reset signal for initializing the integrating unit (integrating step).

The offset removal step outputs a value obtained by subtracting the heat input signal from the input signal.

Advantageous Effects of Invention

The following is achieved with the above circuit and the method for detecting a pressure signal in which a pyroelectric signal is suppressed in the piezoelectric film.

First, an effect of outputting only pressure input signals is ensured by removing a heat input signal using a difference in input speed between the pressure input signal and the heat input signal, as well as differential information.

Second, an effect of significantly reducing the influence on the thermal reaction as compared with the prior art, increasing the reaction speed of the input terminal at the front end, thereby enabling detection of a pressure signal at a higher speed, is ensured.

Third, an effect of outputting a signal with a superior thermal reaction attenuation effect compared with the use of an additional process for heat absorption when a piezoelectric film is produced is ensured.

DESCRIPTION OF EMBODIMENTS

For a full understanding of the invention and its operational advantages and the objects achieved by the practice of the invention, reference should be made to the accompanying drawings illustrating the preferred embodiments of the invention and the content described in the accompanying drawings. The characteristics and the advantages of the present invention will be clarified by the following detailed description based on the accompanying drawings. In advance, it should be noted that the terms and words used in this specification and the claims are based on the principle by which the inventors can properly define the concept of the term in order to best describe their invention. Therefore, a term or a word should be construed as a meaning and a concept consistent with the technical idea of the present invention. In addition, it should be noted that a specific description of known functions related to the present invention and specific explanations of those functions is omitted when the gist of the present invention can be made unnecessarily vague.

Figure 1A:
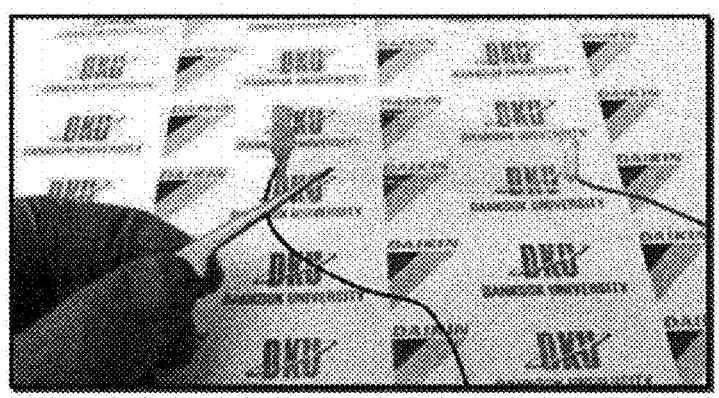
FIG. 1a is a drawing showing a piezoelectric film.
Figure 1B:
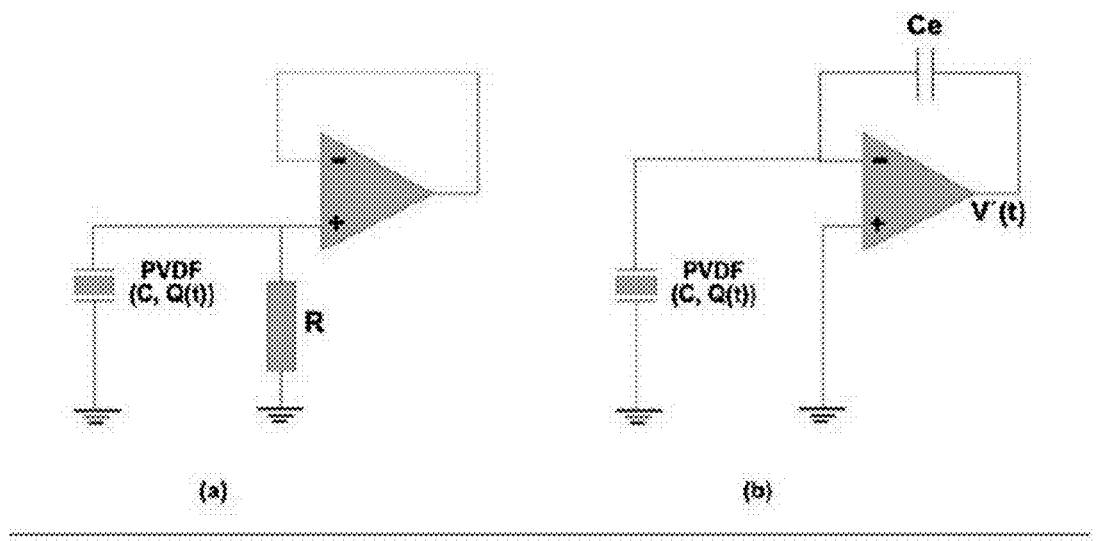
FIG. 1b is a drawing showing the front end of a pressure sensor.
Figure 1C:
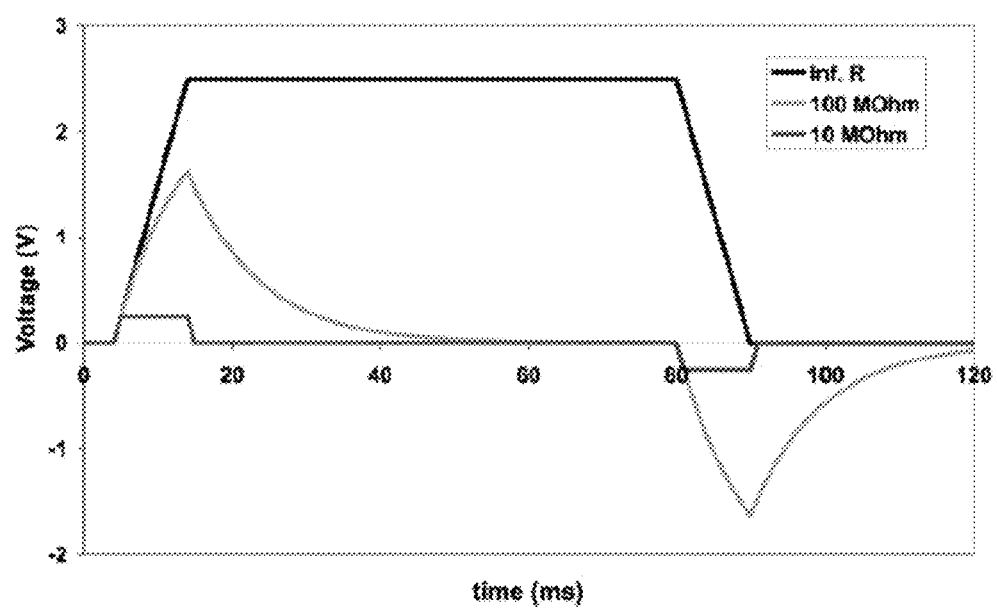
FIG. 1c is a diagram showing an output voltage signal corresponding to input impedance R.
Figure 2A:
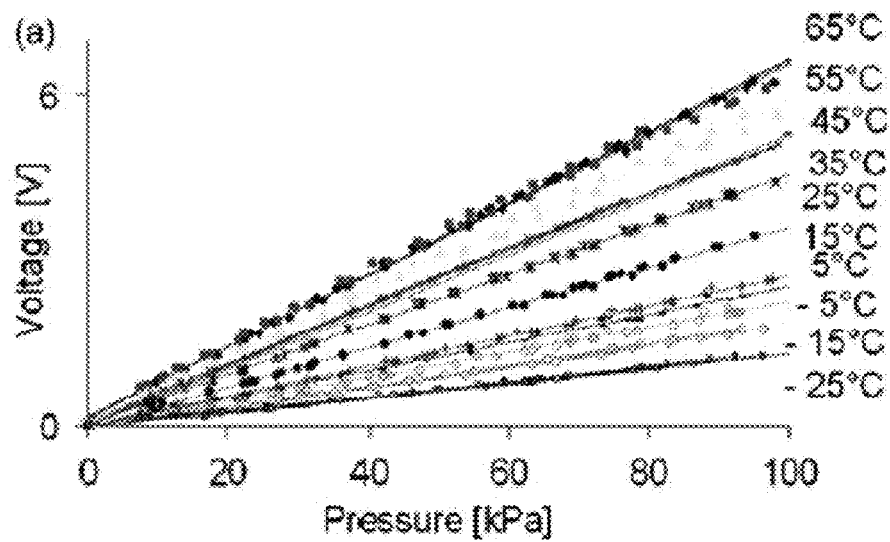
FIG. 2a is a graph showing the characteristics of a piezoelectric element on temperature basis.
Figure 2B:
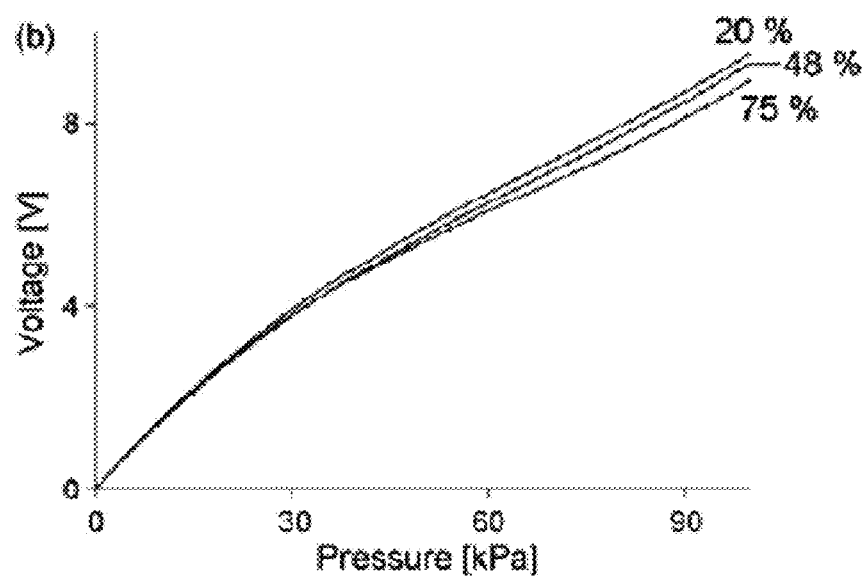
FIG. 2b is a graph showing the characteristics of a piezoelectric element on humidity basis.
Figure 3A:
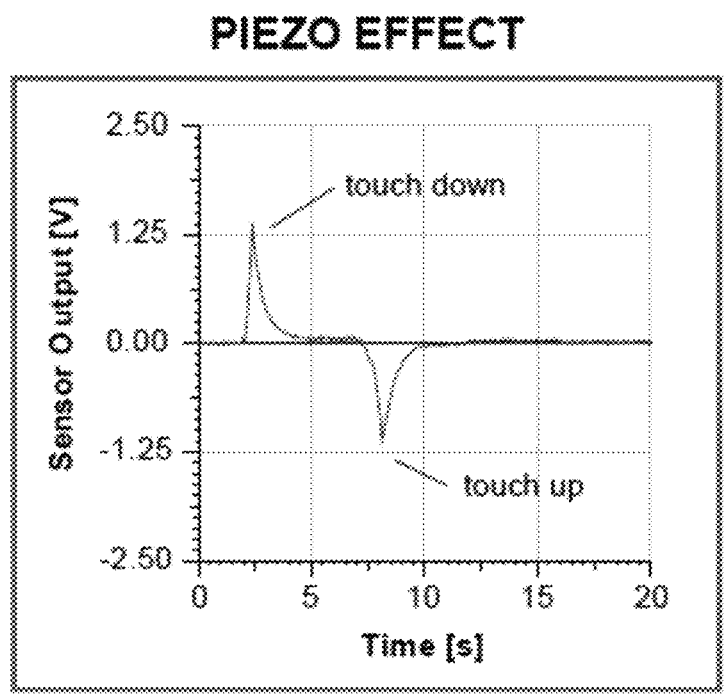
FIG. 3a is a diagram showing a pressure input signal from which a heat input signal is removed.
Figure 3B:
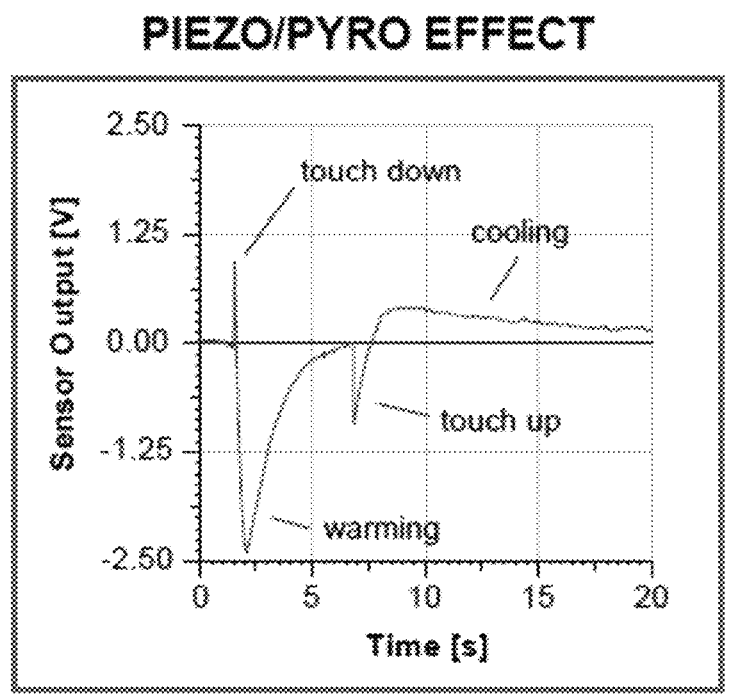
FIG. 3b is a diagram showing a heat input signal together with a pressure input signal.
Figure 4:
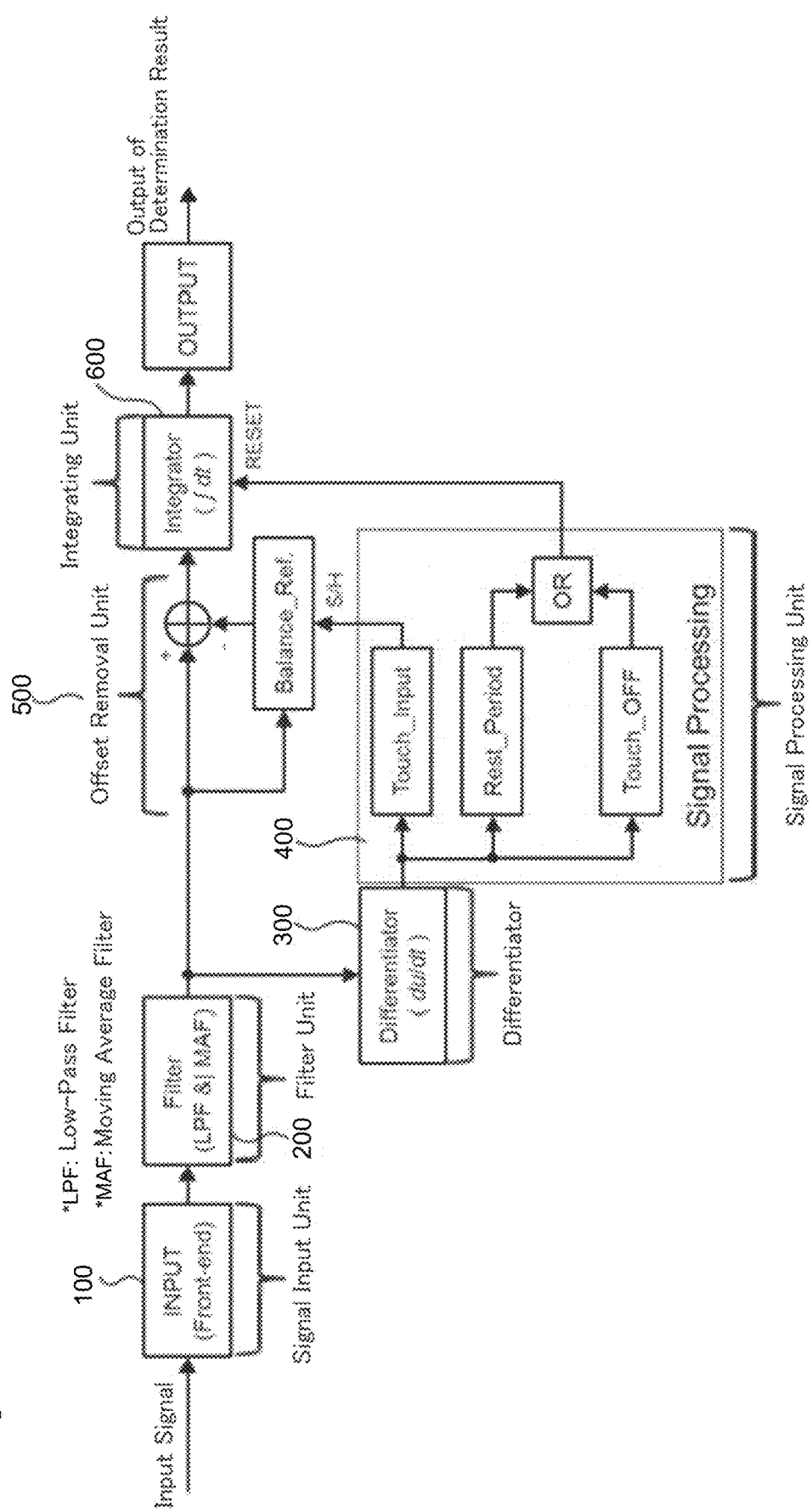
FIG. 4 is a block diagram showing a pressure signal detection circuit in which a pyroelectric signal is suppressed in a piezoelectric film as an embodiment of the present invention.

In the present invention, the piezoelectric material is a pyroelectric piezoelectric material and may also be referred to as a "pyroelectric material." The piezoelectric material may be a ferroelectric. In this embodiment, the piezoelectric material is, but is not limited to, a piezoelectric film. FIG. 4 is a block diagram showing a pressure signal detection circuit in which a pyroelectric signal is suppressed in a piezoelectric film, as an embodiment of the present invention. As shown in FIG. 4, the pressure signal detection circuit in which a pyroelectric signal in a piezoelectric film is suppressed comprises a signal input unit (100) that is constituted of a piezoelectric film and an amplifier and receives input of an input signal from the piezoelectric film, a differentiator (300) for differentiating the input signal for the analysis of the signal component of the input signal, a signal processing unit (400) for outputting an analysis value of the signal component of the input signal based on the differential value of the differentiator (300), an offset removal unit (500) for removing offset of the input signal using the signal component analysis value, and an integrating unit (600) for integrating the input signal to output a pressure input signal value from which a heat input signal value is removed. The pressure signal detection circuit further comprises a filter unit (200) constituted of a low-pass filter (LPF) and a moving average filter (MAF) for removing noise of the input signal supplied from the signal input unit (100). At this point, the filter unit (200) removes 50/60 Hz power noise from the input signal.

The signal processing unit (400) compares the differentiated input signal value with a preset threshold value, and segments the input signal as a pressure input signal or a heat input signal. If the differentiated input signal value is equal to or greater than the preset threshold value, the input signal is determined to be a pressure input signal and the integrating unit is executed. If the differentiated input signal value is smaller than the predetermined threshold value, the input signal is determined to be a heat input signal, and the offset removal unit is executed.

Further, when a pressure input signal during the reference time is not re-detected after a pressure input signal is detected from the differentiated input signal value, the signal processing unit (400) outputs a reset signal for initializing the integrating unit (600). When a pressure input signal is not detected from the differentiated input signal value in all sections, the signal processing unit (400) outputs a reset signal for initializing the integrating unit (600).

The offset removal unit (500) outputs a value obtained by subtracting the heat input signal from the input signal mentioned above.

Figure 5A:
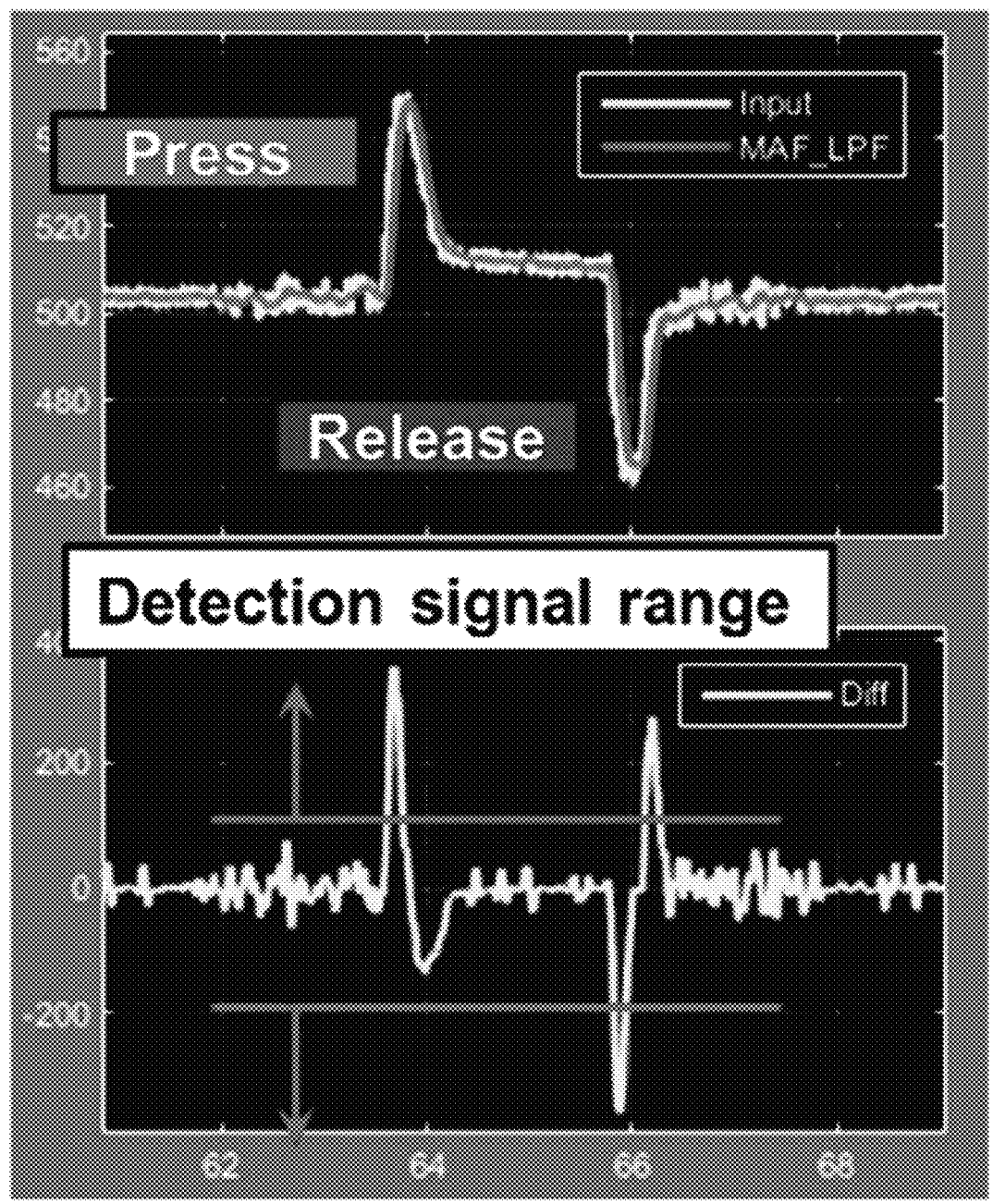
FIG. 5a is a graph showing a pressure input signal by Touch_Input in FIG. 4.
Figure 5B:
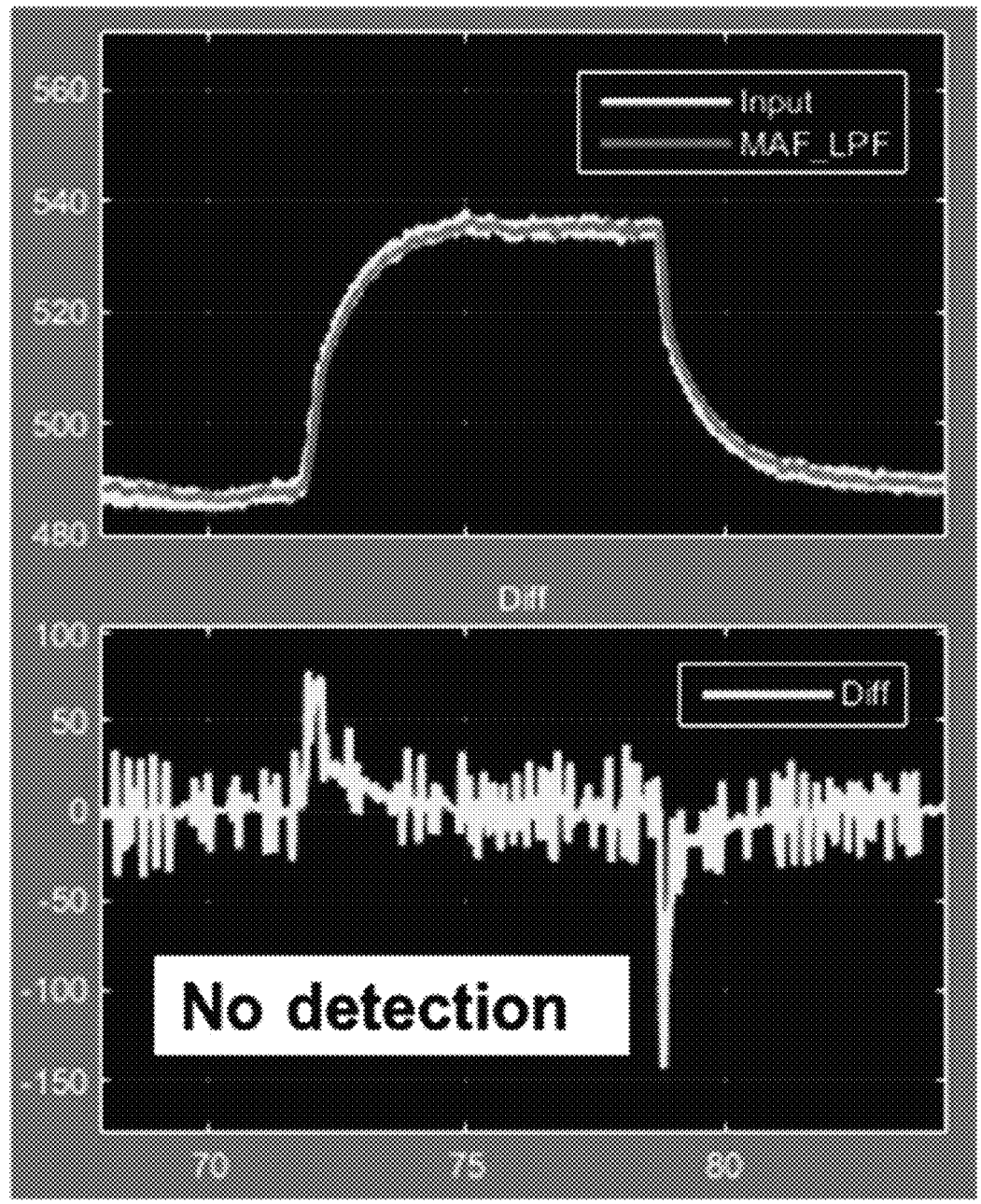
FIG. 5b is a graph showing a heat input signal by Touch_Input in FIG. 4.
Figure 6:
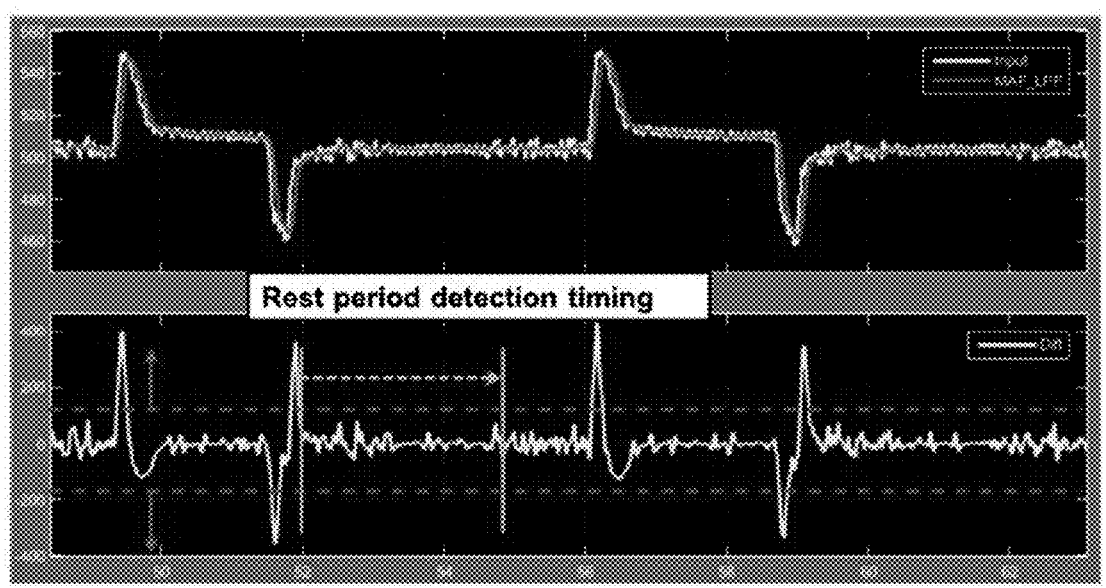
FIG. 6 is a graph showing a pressure input signal by Rest_Period in FIG. 4.
Figure 7A:
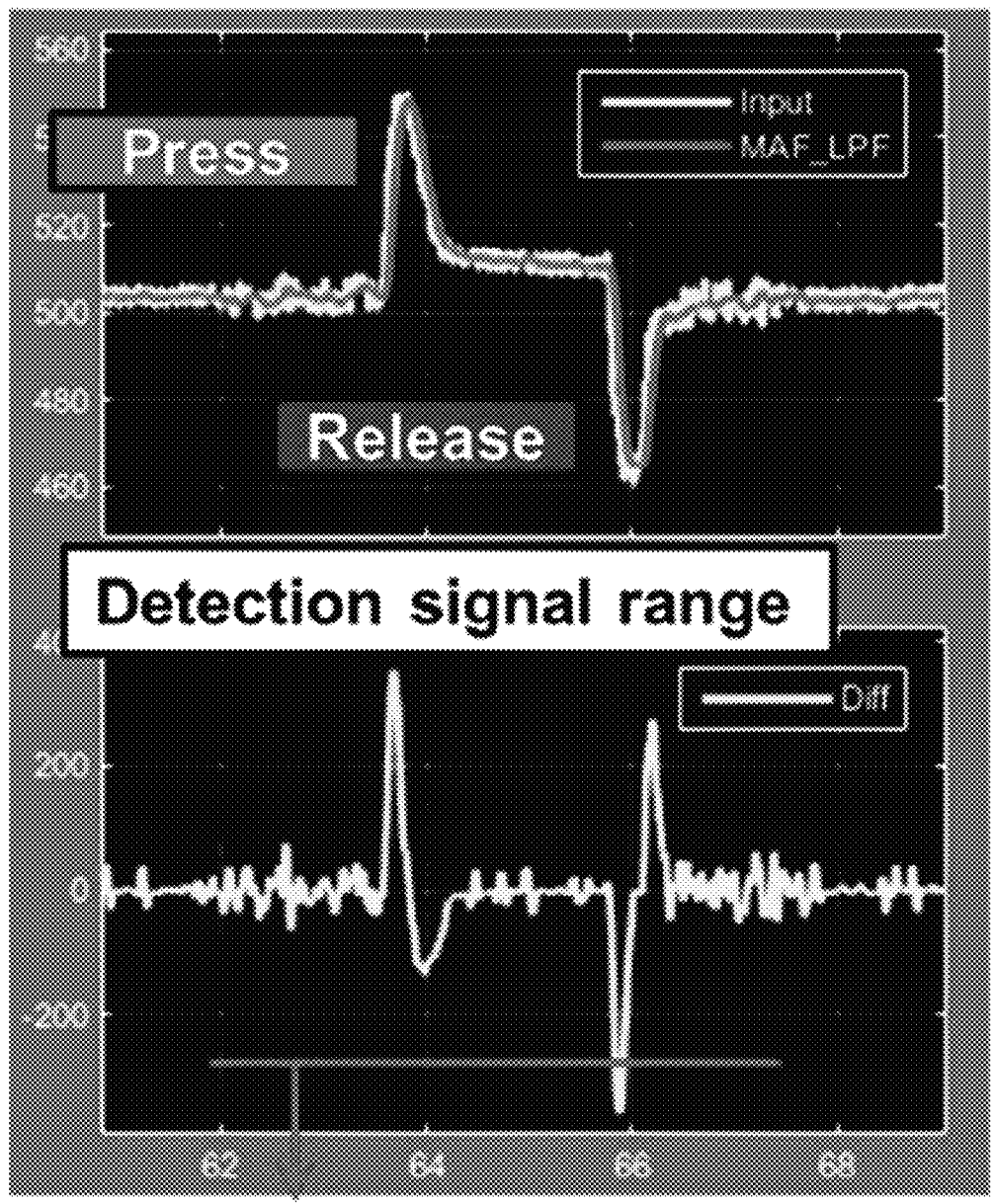
FIG. 7a is a graph showing a pressure input signal by Touch-OFF in FIG. 4.
Figure 7B:
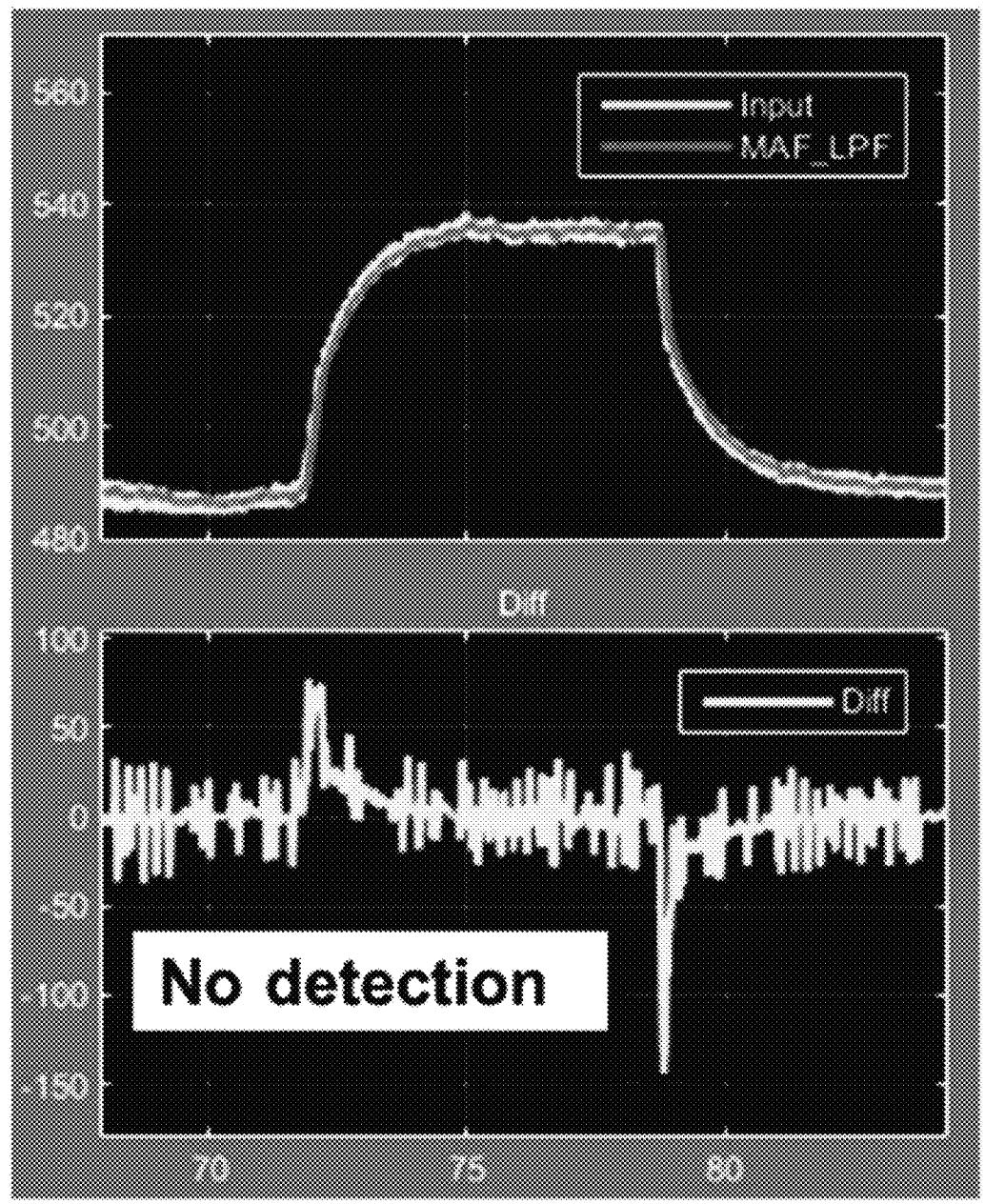
FIG. 7b is a graph showing a heat input signal by Touch-OFF in FIG. 4.

FIG. 5a to FIG. 7b are drawings for specifically explaining the signal processing unit (400) of FIG. 4. FIGS. 5a and 5b are graphs showing a pressure input signal and heat input signal by Touch_Input in FIG. 4. (In the present invention, although the preset threshold value is 100, the value can be easily changed based on the differential value of the heat input signal.) FIG. 6 is a graph showing a pressure input signal by Rest_Period in FIG. 4. FIGS. 7a and 7b are graphs showing a pressure input signal and a heat input signal by Touch_OFF in FIG. 4.

First, Touch_Input in the signal processing unit (400) shown in FIG. 4 determines whether the signal is a pressure input signal or a heat input signal by using information of the differentiated input signal. The differential value of the worst heat input signal is smaller than the differential value of the pressure input signal. The graph specifically showing this is the same as FIG. 5b.

In the cases shown in FIGS. 5a and 5b, an input signal (Input), a Balance_Ref signal (MAF_LPF), and a differentiated input signal (Diff) are included as the pressure input signal and the heat input signal. Referring to FIG. 5a, in the pressure input signal (Input), a large differentiated input signal (Diff) is output due to the conduction speed being relatively faster than that of the heat input signal (Input). At this point, it is possible to output an accurate section (shown with red arrows) in which the pressure input signal is supplied from the differentiated input signal (Diff).

On the other hand, referring to FIG. 5b, a comparison between the pressure input signal (Input) and the heat input signal (Input) reveals that the heat input signal (Input) reacts more smoothly than the pressure input signal (Input) due to the conduction speed of the temperature input signal. Accordingly, the signal obtained by differentiating the heat input signal (Input) is output as a small value (Diff). The differentiated input signal (Diff) does not exceed 100, which is the value of the preset threshold value. This degree of a threshold value is larger than the differentiated input signal even in the presence of the maximum heat change; however, the threshold value may be easily changed according to the surrounding environment.

Rest_Period in the signal processing unit (400) of FIG. 4 determines whether a pressure input signal during the reference time is re-detected after a pressure input signal is detected from the differentiated input signal value. The graph specifically showing this operation is the same as FIG. 6.

In the case shown in FIG. 6, an input signal (Input), a Balance_Ref signal (MAF_LPF), and a differentiated input signal (Diff) are included as the pressure input signal.

As shown in FIG. 6, if a pressure input signal is not re-detected for a certain period of time (see the part shown with a blue dotted arrow) from the differentiated input signal (Diff), the signal processing unit (400) outputs a reset signal for initializing the integrating unit (600).

Touch_OFF in the signal processing unit (400) of FIG. 4 determines whether or not a pressure input signal is detected from the differentiated input signal value (Diff) in all sections. The presence or absence of the detection is determined based on a circumstance in which the differentiated input signal value (Diff) becomes a large negative value.

When the circumstance in which the value of the differential input signal (Diff) becomes a large negative value (shown with a red arrow and line) is displayed as shown in FIG. 7a, the signal processing unit (400) outputs a reset signal for initializing the integrating unit (600).

FIG. 7b shows that, in this case, a pressure input signal is not detected as a heat input signal in all sections.

Figure 8:
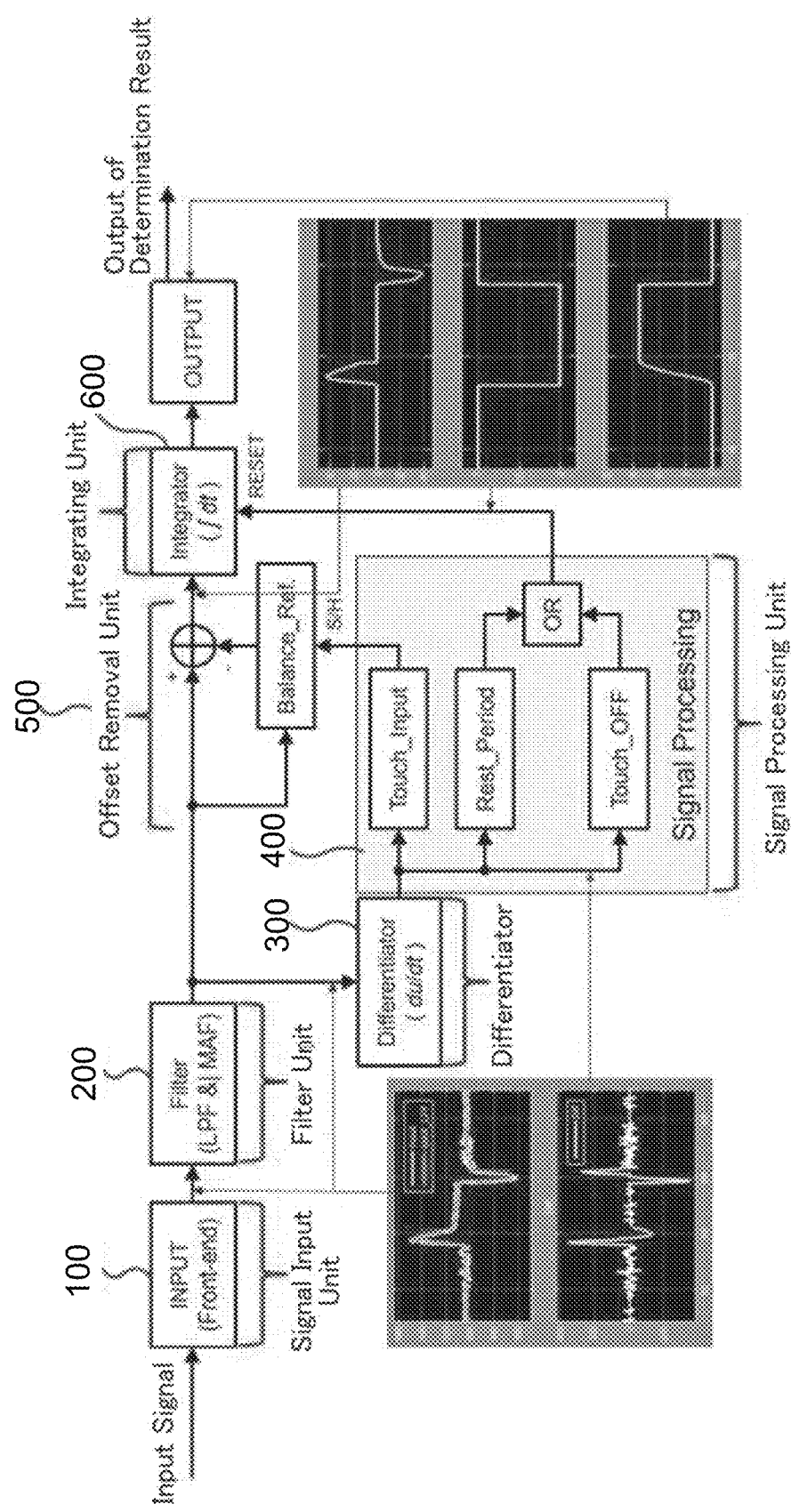
FIG. 8 is a drawing showing operation of the entire system using a pressure input signal as an embodiment of the present invention.
Figure 9:
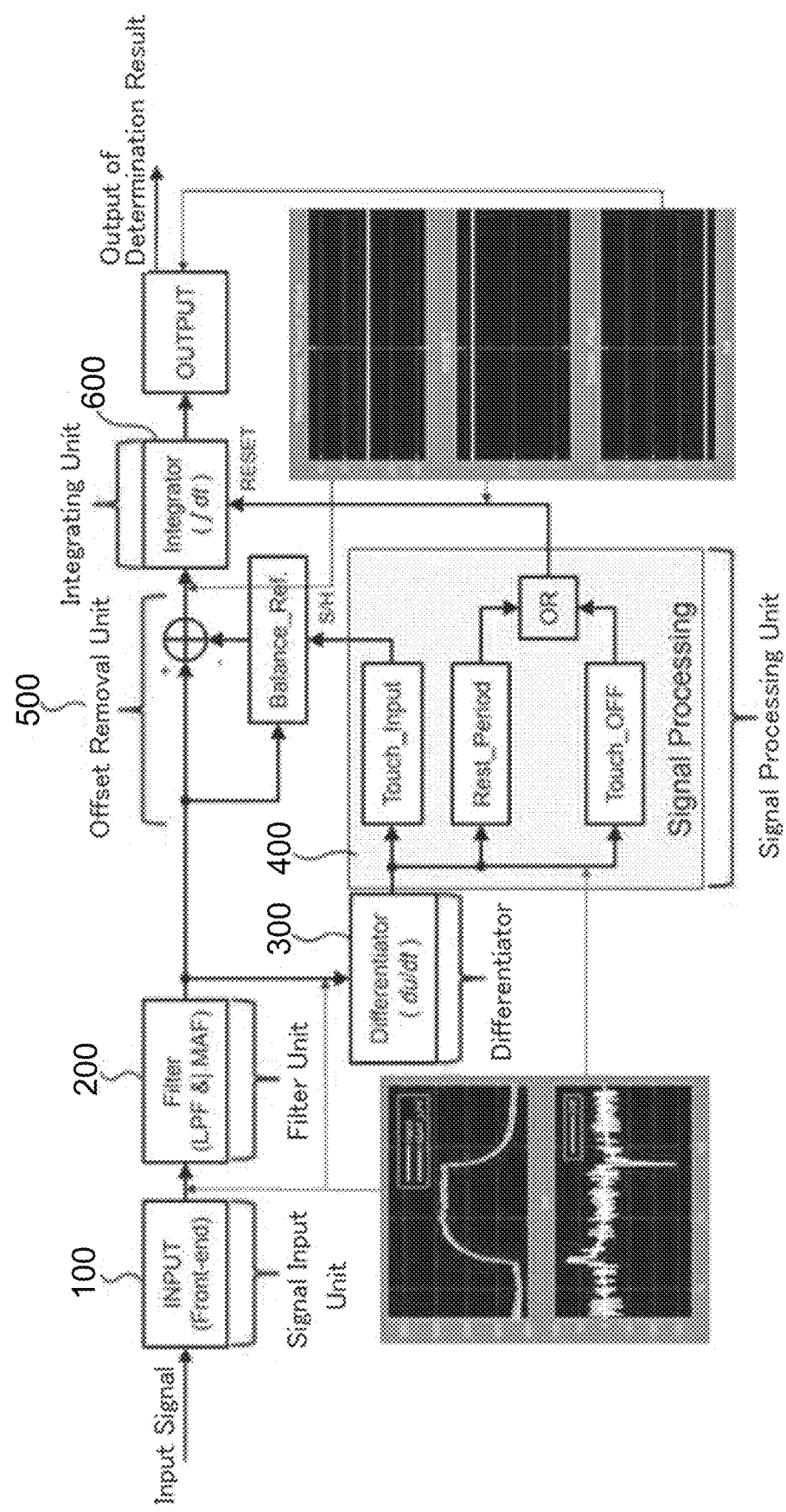
FIG. 9 is a drawing showing operation of the entire system using a heat input signal as an embodiment of the present invention.

FIG. 8 is a drawing showing the operation of the entire system using a pressure input signal as an embodiment of the present invention, and FIG. 9 is a drawing showing the operation of the entire system using a heat input signal as an embodiment of the present invention. As shown in FIGS. 8 and 9, the input signal (Input) is first supplied to the signal input unit (100) as a signal from the piezoelectric film, and then transmitted to the filter unit (200). Noise is removed from the transmitted input signal (Input) by the filter unit (200) constituted of a low-pass filter (LPF) and a moving average filter (MAF). The signal output at this point is a Balance_Ref signal (MAF_LPF). The Balance_Ref signal (MAF_LPF) is supplied to the differentiator (300) to be differentiated. The signal output at this point is the differentiated input signal (Diff). The differentiated input signal (Diff) is transmitted to Touch_Input, and Touch_Input determines whether the signal thus transmitted is a heat input signal or a pressure input signal.

As shown in FIG. 8, Balance_Ref. serves to fix the input signal when the differentiated input signal (Diff) is determined to be a pressure input signal. Conversely, as shown in FIG. 9, when the differentiated input signal (Diff) is determined to be a heat input signal, the input signal thus determined as a heat input signal is removed as being regarded as a meaningless signal by the offset removal unit (500) (determination as to whether to execute the offset removal unit (500) is performed using the input signal thus determined). When a pressure input signal is not detected, the input signal (Input) and the Balance_Ref signal (MAF_LPF) have the same value. When a pressure input signal is detected from the differentiated input signal (Diff), Balance_Ref. detects only an accurate input section where a pressure input signal is supplied. Balance_Ref. (MAF_LPF) holds only the signal immediately before the detection of the pressure input signal. At this point, the process of removing the meaningless signal is performed as a process of outputting 0, which is a value obtained by subtracting the heat input signal output from Touch-Input from the input signal output from the filter unit (200). In the above removal process, various signals other than the pressure input signal, including a heat input signal, are removed. As a result, the signal output from the offset removal unit (500) is neatly (clearly) output by the offset removal unit (500). In FIG. 9, the signal output from the offset removal unit (500) is 0.

As shown in FIG. 8, the integrating unit (600) is provided so as to output the process of input signal transmission; the integrating unit (600) integrates the input signal to restore a pressure input signal. This is because, although the presence or absence of pressure application by the pressure signal detection from the piezoelectric film is perceivable, the process of applying a pressure is not perceivable.

Figure 10:
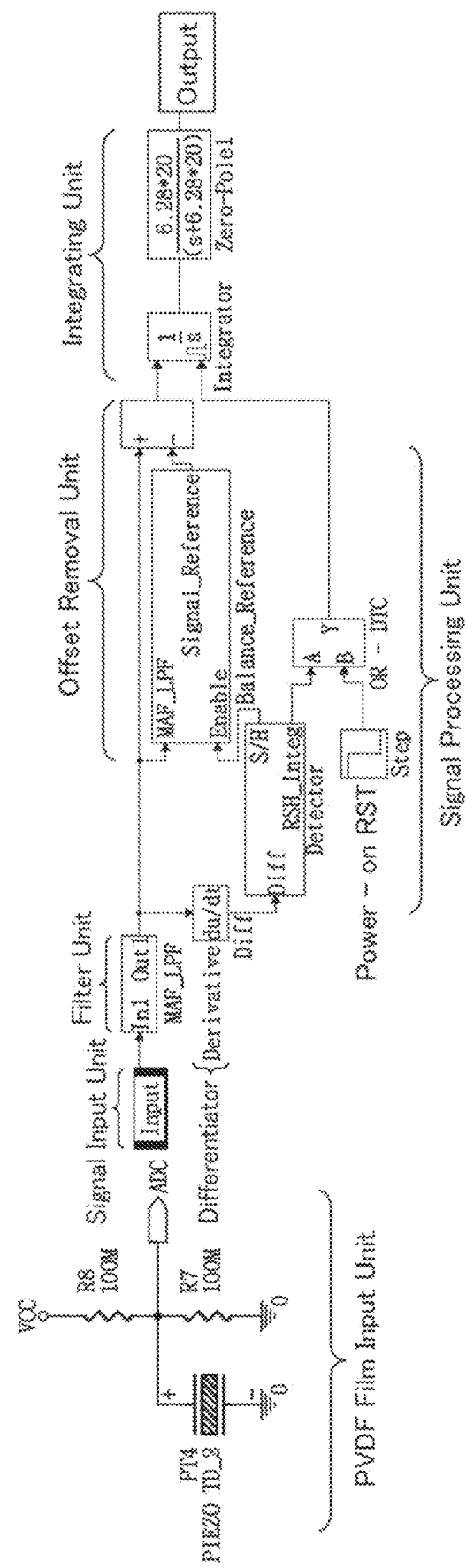
FIG. 10 is a diagram showing a Simulink-implemented digital system using an ADC conversion input as an embodiment of the present invention.
Figure 11A:
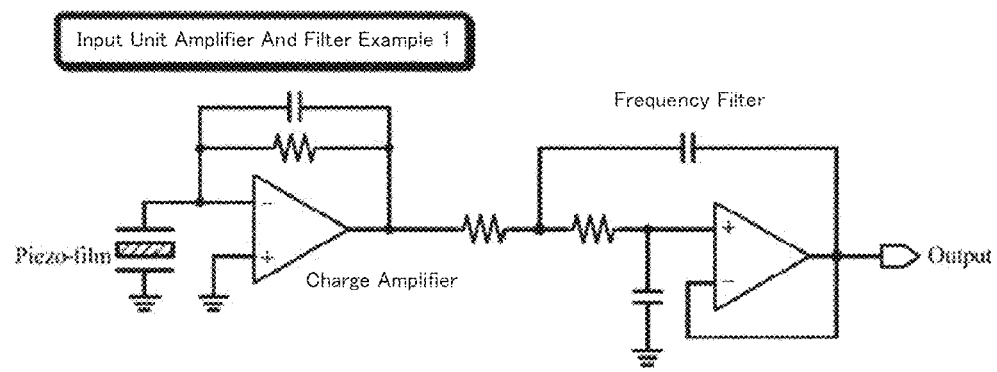
FIG. 11a is a drawing showing a system in which an analog amplifier and a filter circuit are added to a piezoelectric film input unit, as an embodiment of the present invention.
Figure 11B:
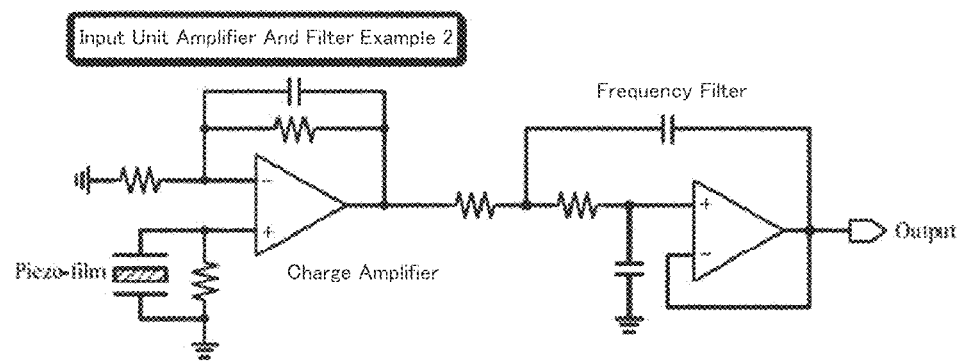
FIG. 11b is a drawing showing a system in which an analog amplifier and a filter circuit are added to a piezoelectric film input unit, as an embodiment of the present invention.

FIG. 10 is a drawing showing a Simulink-implemented digital system using ADC conversion input, as an embodiment of the present invention. FIGS. 11a to 11b are drawings showing a system in which an analog amplifier and a filter circuit are added to a piezoelectric film input unit, as an example of the present invention. The filter unit (200), the differentiator (300), and the integrating unit (600) shown in FIG. 10 can be implemented with digital and analog circuits. The signal processing unit (400) can be implemented with an analog circuit or a microprocessor, and the microprocessor's memory may also be used. At this point, the memory recognizes the pressure input signal and stores it in real time in order to store the input signal and analysis data of the signal component of the input signal. Furthermore, a sensor for compensation according to the temperature and humidity may be added to the signal processing unit (400).

As shown in FIGS. 11a to 11b, this can be implemented with a circuit using a piezoelectric film input unit amplifier. At this point, the analog amplifier can amplify a piezoelectric signal to an appropriate signal level, and the filter circuit is used for noise removal.

Figure 12:
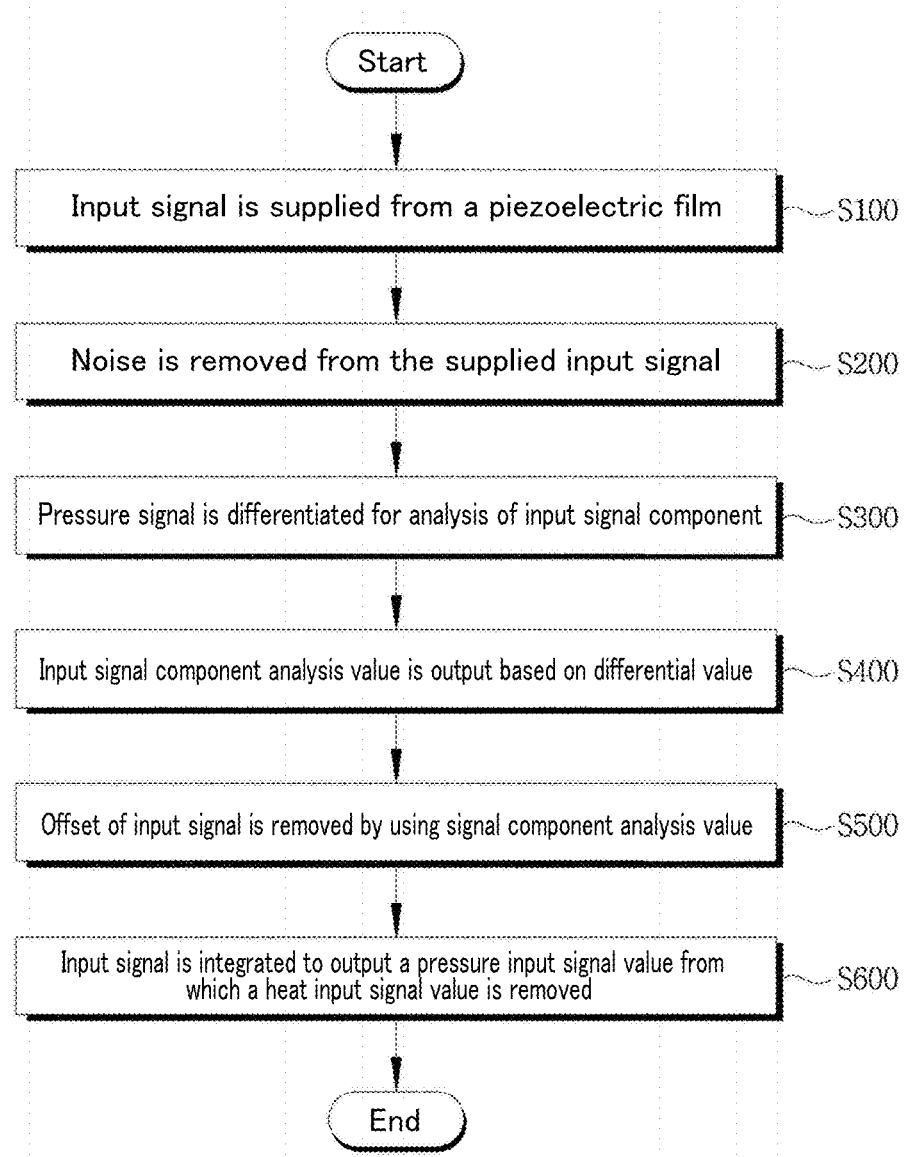
FIG. 12 is a flow chart showing a pressure signal detection method in which a pyroelectric signal is suppressed in a piezoelectric film as an embodiment of the present invention.

FIG. 12 is a flow chart showing, as an embodiment of the present invention, a pressure signal detection method in which a pyroelectric signal is suppressed in a piezoelectric film. As shown in FIG. 12, the pressure signal detection method in which a pyroelectric signal is suppressed in the piezoelectric film comprises a signal input step (S100) for receiving input of an input signal from a piezoelectric film in a signal input unit (100), a differentiating step (S300) for differentiating the input signal for the analysis of the signal component of the input signal in a differentiator (300), a signal processing step (S400) for outputting an analysis value of the signal component of the input signal based on the differential value of the differentiator in a signal processing unit (400), an offset removal step (S500) for removing offset of the input signal using the signal component analysis value from the signal processing unit (400) in an offset removal unit (500), an integrating step (S600) for integrating the input signal to output a pressure input signal value from which a heat input signal value is removed in an integrating unit (600) (at an integrating unit 600), and further comprises a filter step (S200) for removing noise of the input signal from the filter unit (200) so as to remove noise of the input signal supplied in the signal input step (S100). At this point, the filter step (S200) removes 50/60 Hz power noise from the input signal.

In the signal processing step (S400), the differentiated input signal value is compared with a preset threshold value to determine whether the input signal is a pressure input signal or a heat input signal. If the differentiated input signal value is equal to or greater than the predetermined threshold value, the input signal is determined to be a pressure input signal, and the integrating step (S600) is executed. If the differentiated input signal value is smaller than the predetermined threshold value, the input signal is determined to be a heat input signal, and the offset removal step (S500) is executed.

Further, in the signal processing step (S400), when a pressure input signal during the reference time is not re-detected after a pressure input signal is detected from the differentiated input signal value, a reset signal for initializing the integrating step (S600) (integrating unit (600)) is output. In the signal processing step (S400), when a pressure input signal is not detected from the differentiated input signal value in all sections, a reset signal for initializing the integrating step (S600) (integrating unit (600)) is output.

In the offset removal step (S500), a value obtained by subtracting the heat input signal from the input signal is output.

Figure 13A:
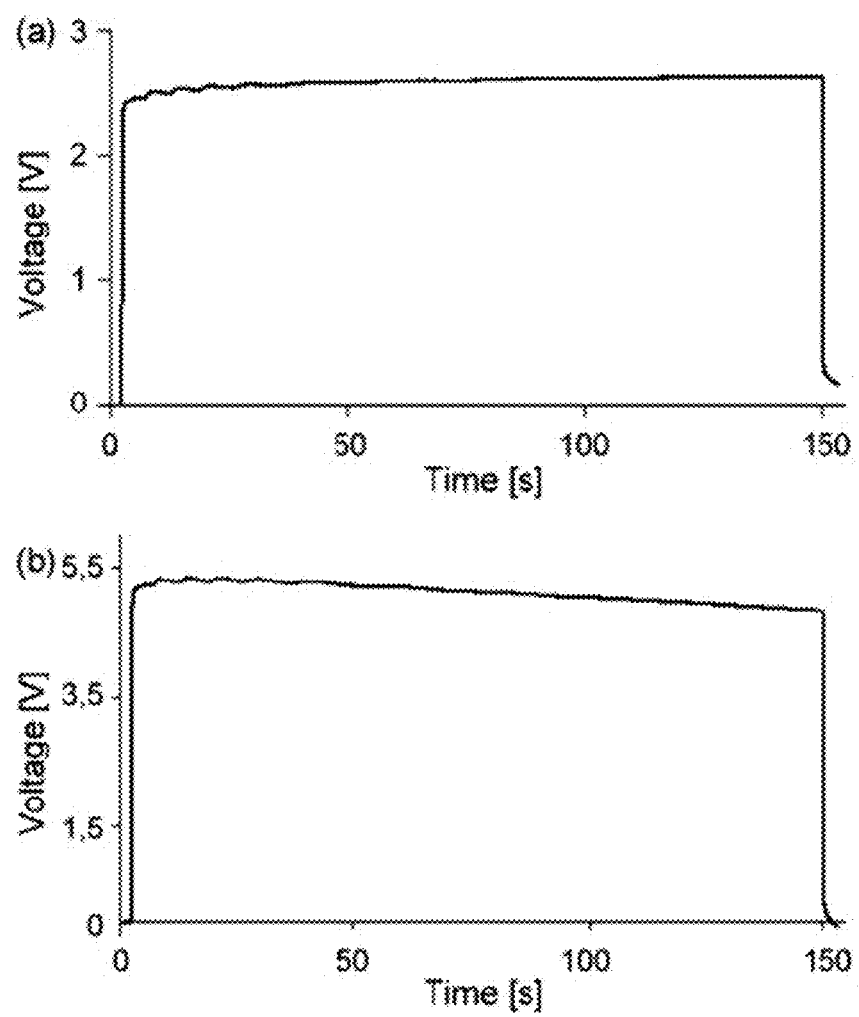
FIG. 13a is a drawing showing changes in the output signal of a piezoelectric element according to the temperature environment.
Figure 13B:
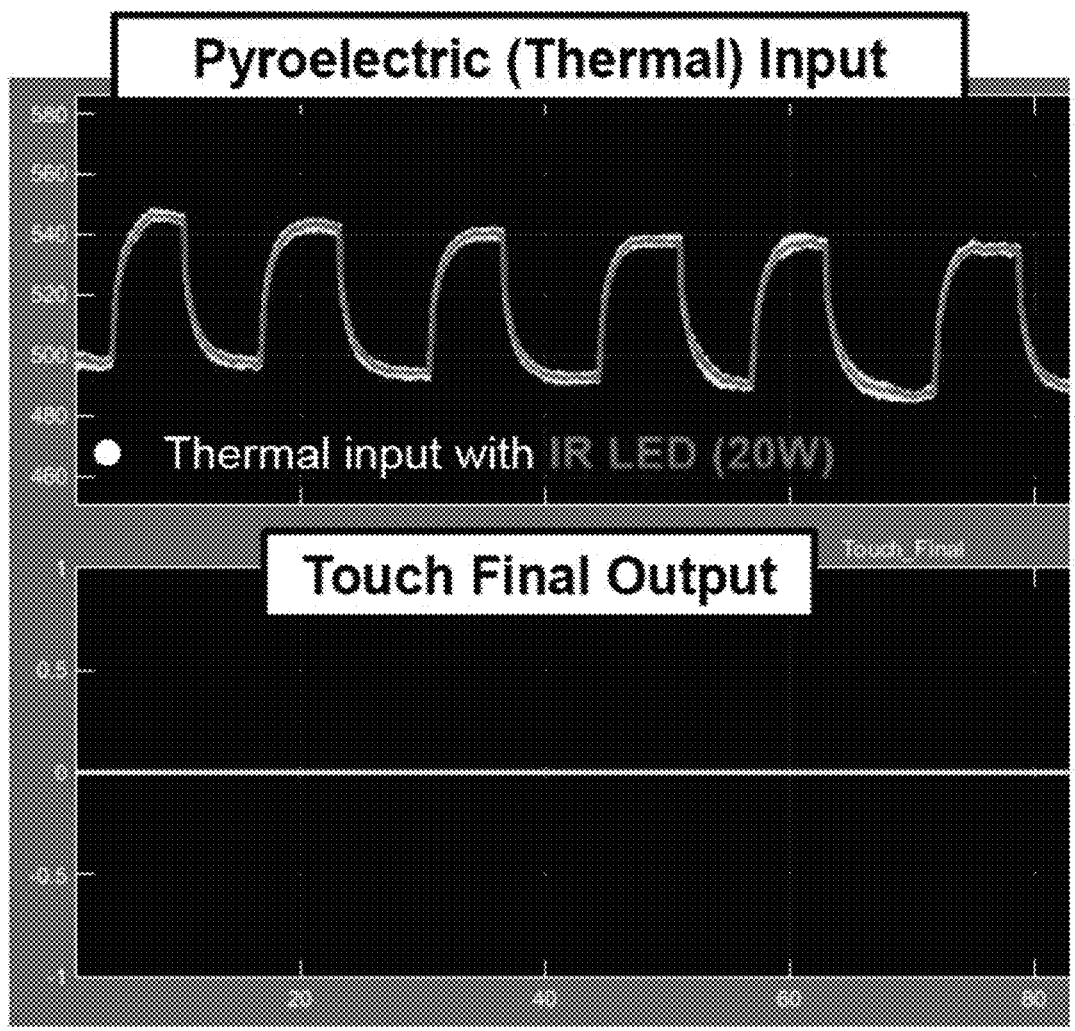
FIG. 13b is a drawing showing changes in the output signal of a piezoelectric element according to a severe temperature environment, as an embodiment of the present invention.

FIG. 13a is a drawing showing changes in output signal of a piezoelectric element according to the temperature environment. FIG. 13b is a drawing showing changes in the output signal of a piezoelectric element according to a severe temperature environment, as an embodiment of the present invention. As shown in FIG. 13a, the output signal of the piezoelectric element is affected not only by the pressure but also by the environment due to heat (temperature) (the upper graph shows the output voltage of the piezoelectric sensor when a constant pressure of 200 kPa is applied at −10° C. for 150 seconds, and the lower graph shows the output voltage of the piezoelectric sensor when a constant pressure of 200 kPa is applied at 50° C. for 150 seconds).

On the other hand, as shown in FIG. 13b, the change in the output signal of the piezoelectric element according to one embodiment of the present invention is not affected by the change in the environment due to heat (temperature).

The pressure signal detection circuit of the present invention may be applied to a piezoelectric film in which a heat absorbing substance is added, or a piezoelectric film (bimorph piezoelectric film or the like) having a structure for attenuating pyroelectric signals. In these applications, the SN ratio can be improved compared with the mode in which the pressure signal detection circuit of the present invention is applied to a normal piezoelectric film, and it therefore becomes possible to detect even weaker pressures.

The material of the piezoelectric film is described below.

The piezoelectric film used in the present invention is preferably an organic pyroelectric film, and more preferably an organic ferroelectric film.

As would usually be understood by a person skilled in the art, the "organic film," such as an organic piezoelectric film, organic pyroelectric film, or organic ferroelectric film, is a film formed of an organic polymer (a polymer film). As would be usually understood by a person skilled in the art, the "organic piezoelectric film" is an organic film having piezoelectricity. The organic pyroelectric film is an organic film having pyroelectricity (and piezoelectricity). The organic ferroelectric film is an organic film having ferroelectricity (and pyroelectricity and piezoelectricity).

The organic film for constituting the organic pyroelectric film used in the present invention is explained below.

Preferable examples of organic films include vinylidene fluoride-based polymer films, odd-chain nylon films, and vinylidene cyanide-vinyl acetate copolymers.

The organic film used in the present invention is preferably a vinylidene fluoride-based polymer film.

As would be usually understood by a person skilled in the art, the "vinylidene fluoride-based polymer film" is a film constituted of a vinylidene fluoride-based polymer, and comprises a vinylidene fluoride-based polymer.

In this specification, preferable examples of the vinylidene fluoride-based polymer film include polyvinylidene fluoride films, vinylidene fluoride-tetrafluoroethylene copolymer films, and vinylidene fluoride-trifluoroethylene copolymer films.

The terms "polyvinylidene fluoride films," "vinylidene fluoride-tetrafluoroethylene copolymer films," and "vinylidene fluoride-trifluoroethylene copolymer films" used in this specification are intended to include films comprising such a polymer as a base material.

The polymer content of the organic film used in the present invention is preferably 50 mass % or more, more preferably 70 mass % or more, even more preferably 80 mass % or more, still even more preferably 85 mass % or more, particularly 90 mass % or more, and more particularly preferably 95 mass % or more. The upper limit of the content is not particularly limited. For example, the upper limit may be 100 mass % or 99 mass %.

The "organic film" may optionally contain one or more components other than the polymer as long as the effect of the present invention is not significantly impaired. Examples of such other components include additives typically used in resin films.

Preferable examples of the polymer include vinylidene fluoride-based polymers.

Examples of "vinylidene fluoride-based polymer" include (1) a copolymer of vinylidene fluoride and one or more monomers copolymerizable with vinylidene fluoride, and (2) polyvinylidene fluoride.

Examples of the "monomers copolymerizable with vinylidene fluoride" in the "(1) copolymer of vinylidene fluoride and one or more monomers copolymerizable with vinylidene fluoride" include trifluoroethylene, tetrafluoroethylene, hexafluoropropylene, chlorotrifluoroethylene, and vinyl fluoride. The "one or more monomers copolymerizable with vinylidene fluoride" or at least one of the monomers is preferably tetrafluoroethylene.

Preferred examples of the "vinylidene fluoride-based polymers" include a vinylidene fluoride-tetrafluoroethylene copolymer.

The "(1) copolymer of vinylidene fluoride and one or more monomers copolymerizable with vinylidene fluoride" preferably contains 5 mol % or more, 10 mol % or more, 15 mol % or more, 20 mol % or more, 25 mol % or more, 30 mol % or more, 35 mol % or more, 40 mol % or more, 45 mol % or more, 50 mol % or more, or 60 mol % or more, of repeating units derived from vinylidene fluoride.

The molar ratio of the repeating units derived from tetrafluoroethylene to the repeating units derived from vinylidene fluoride in the "vinylidene fluoride-tetrafluoroethylene copolymer" is preferably within the range of 5/95 to 90/10, more preferably 5/95 to 75/25, even more preferably 15/85 to 75/25, and still even more preferably 36/64 to 75/25.

The copolymer with a high content of vinylidene fluoride is preferable in terms of excellent solvent solubility and excellent processability of the film.

The molar ratio of the repeating units derived from tetrafluoroethylene to the repeating units derived from vinylidene fluoride in the vinylidene fluoride/tetrafluoroethylene copolymer is preferably within the range of 5/95 to 37/63, more preferably 10/90 to 30/70, and still more preferably 5/85 to 25/75.

The copolymer with a higher tetrafluoroethylene content is preferable in terms of excellent heat resistance of the film. The molar ratio of the repeating units derived from tetrafluoroethylene to the repeating units derived from vinylidene fluoride in the vinylidene fluoride-tetrafluoroethylene copolymer is preferably within the range of 60/40 to 10/90, more preferably 50/50 to 25/75, and even more preferably 45/55 to 30/70.

The vinylidene fluoride-tetrafluoroethylene copolymer may contain repeating units derived from a monomer other than vinylidene fluoride and tetrafluoroethylene insofar as the properties of the present invention are not significantly impaired. The content of such repeating units can be usually, for example, 20 mol % or less, 10 mol % or less, 5 mol % or less, or 1 mol % or less. Such monomers are not limited as long as they can be copolymerized with a vinylidene fluoride monomer and/or a tetrafluoroethylene monomer. Examples include:

(1) HFO-1234yf ($CF_3CF=CH_2$), 3,3,4,4,5,5,6,6,7,7,8,8,8-tridecafluorooct-1-ene ($C_6$ olefin), fluoromonomers (e.g., vinyl fluoride (VF), trifluoroethylene (TrFE), hexafluoropropene (HFP), 1-chloro-1-fluoro-ethylene (1,1-CFE), 1-chloro-2-fluoro-ethylene (1,2-CFE), 1-chloro-2,2-difluoroethylene (CDFE), chlorotrifluoroethylene (CTFE), trifluorovinyl monomers, 1,1,2-trifluorobutene-4-bromo-1-butene, 1,1,2-trifluorobutene-4-silane-1-butene, perfluoroalkyl vinyl ether, perfluoromethyl vinyl ether (PMVE), perfluoropropyl vinyl ether (PPVE), perfluoroacrylate, 2,2,2-trifluoroethyl acrylate, and 2-(perfluorohexyl)ethyl acrylate); and (2) hydrocarbon-based monomers (e.g., ethylene, propylene, maleic anhydride, vinyl ether, vinyl ester, allyl glycidyl ether, acrylic acid-based monomers, methacrylic acid based monomers, and vinyl acetate).

It would be understood by a person skilled in the art that the present invention is not limited to the structure and effects illustrated and described in the preferred examples described above for giving examples of the technical idea of the present invention, and various modifications and alterations may be made without departing from the scope of the technical idea. Accordingly, all of such appropriate modifications and alterations are included in the scope of the present invention.

INDUSTRIAL APPLICABILITY

The pressure signal detection circuit of the present invention is applicable to a device comprising a piezoelectric material having pyroelectricity and a circuit for processing output signals of the piezoelectric material. More specifically, a device comprising a circuit for processing output signals of the piezoelectric material and the pressure signal detection circuit of the present invention is also included in the scope of the present invention. Examples of the devices include touch panels, biosensors, vibration sensors, pressure sensors, and information terminal devices.

REFERENCE NUMERALS

100: Signal Input Unit
200: Filter Unit
300: Differentiator
400: Signal Processing Unit
500: Offset Removal Unit
600: Integrating Unit

The invention claimed is:

1. A pressure signal detection circuit in which a pyroelectric signal obtained from a piezoelectric material is suppressed, the pressure signal detection circuit comprising an offset removal circuit for subtracting a heat input signal from an input signal from the piezoelectric material using a difference in input speed between a pressure input signal and a heat input signal.

2. The pressure signal detection circuit according to claim 1, comprising a differentiator for differentiating an input signal to analyze a signal component of the input signal from the piezoelectric material.

3. The pressure signal detection circuit according to claim 2, comprising:
a signal input circuit for receiving input of an input signal from the piezoelectric material;
a differentiator for differentiating an input signal to analyze a signal component of the input signal;
a signal processing circuit for outputting a signal component analysis value of the input signal based on the differential value of the differentiator;
the offset removal circuit further for removing offset of the input signal using the signal component analysis value; and
an integrator for integrating the input signal to output a pressure input signal value from which a heat input signal value is removed.

4. The pressure signal detection circuit according to claim 3, further comprising:
a filter circuit constituted of a low pass filter (LPF) and a moving average filter (MAF) for removing noise of the input signal supplied from the signal input circuit.

5. The pressure signal detection circuit according to claim 3, wherein the signal processing circuit compares the differentiated input signal value with a preset threshold value to determine whether the input signal is a pressure input signal or a heat input signal.

6. The pressure signal detection circuit according to claim 5, wherein when the differentiated input signal value is equal to or larger than the preset threshold value, the input signal is determined to be a pressure input signal, and the integrator is executed; and when the differentiated input signal value is smaller than the preset threshold value, the input signal is determined to be a heat input signal, and the offset removal circuit is executed.

7. The pressure signal detection circuit according to claim 3, wherein, when a pressure input signal during a reference time is not re-detected after a pressure input signal is detected from the differentiated input signal value, the signal processing circuit outputs a reset signal for initializing the integrator.

8. The pressure signal detection circuit according to claim 3, wherein, when a pressure input signal is not detected from the differentiated input signal value in all sections, the signal processing circuit outputs a reset signal for initializing the integrator.

9. The pressure signal detection circuit according to claim 3, wherein the offset removal circuit outputs a precise pressure value that is obtained by subtracting the heat input signal and a noise signal from the input signal.

10. The pressure signal detection circuit according to claim 1, wherein the piezoelectric material is a piezoelectric film.

11. A device comprising a piezoelectric material and the pressure signal detection circuit according to claim 1.

12. The device according to claim 11, wherein the device is a touch panel, a biosensor, a vibration sensor, a pressure sensor, or an information terminal device.

13. A pressure signal detection method in which a pyroelectric signal obtained from a piezoelectric material is suppressed, the pressure signal detection method comprising an offset removal circuit for subtracting a heat input signal from an input signal from the piezoelectric material using a difference in input speed between a pressure input signal and a heat input signal.

14. The pressure signal detection method according to claim 13, comprising a differentiator for differentiating an input signal to analyze a signal component of the input signal from the piezoelectric material.

15. The pressure signal detection method according to claim 14, comprising:
a signal input step of receiving input of an input signal from the piezoelectric material in a signal input circuit;
a differentiating step of differentiating an input signal to analyze a signal component of the input signal in a differentiator;
a signal processing step of outputting a signal component analysis value of the input signal based on the differential value of the differentiator in a signal processing circuit;
an offset removal step of removing offset of the input signal using the signal component analysis value of the signal processing circuit in offset removal; and an integrating step of integrating the input signal in an integrator to output a pressure input signal value from which a heat input signal value is removed.

16. The pressure signal detection method according to claim 15, further comprising a filter step of removing noise of the input signal in a filter circuit so as to remove noise from the input signal supplied in the signal input step.

17. The pressure signal detection method according to claim 15, wherein in the signal processing step, the differentiated input signal value is compared with a preset threshold value to determine whether the input signal is a pressure input signal or a heat input signal.

18. The pressure signal detection method according to claim 17, wherein:
when the differentiated input signal value is equal to or larger than the preset threshold value, the input signal is determined to be a pressure input signal, and the integrating step is executed; and
when the differentiated input signal value is smaller than the preset threshold value, the input signal is determined to be a heat input signal, and the offset removal step is executed.

19. The pressure signal detection method according to claim 15, wherein in the signal processing step, a reset signal for initializing the integrating step is output when a pressure input signal during a reference time is not re-detected after a pressure input signal is detected from the differentiated input signal value.

20. The pressure signal detection method according to claim 15, wherein in the signal processing step, a reset signal for initializing the integrating step is output when a pressure input signal is not detected from the differentiated input signal value in all sections.

21. The pressure signal detection method according to claim 15, wherein
in the offset removal step, a precise pressure value that is obtained by subtracting the heat input signal and a noise signal from the input signal is output.

22. The pressure signal detection method according to claim 13, wherein the piezoelectric material is a piezoelectric film.

* * * * *